(12) United States Patent
Chiu et al.

(10) Patent No.: US 8,434,217 B2
(45) Date of Patent: May 7, 2013

(54) MOUNTING APPARATUS FOR CIRCUIT BOARD

(75) Inventors: Po-Wen Chiu, New Taipei (TW); Wen-Hu Lu, Shenzhen (CN); Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/231,143

(22) Filed: Sep. 13, 2011

(65) Prior Publication Data

US 2012/0304457 A1 Dec. 6, 2012

(30) Foreign Application Priority Data

May 30, 2011 (CN) .......................... 2011 1 0142246

(51) Int. Cl.
*B23P 19/00* (2006.01)
(52) U.S. Cl.
USPC .............. 29/739; 29/757; 29/432.2; 361/759
(58) Field of Classification Search .................... 29/739, 29/729, 432.2, 512; 361/726–727, 759, 801–803; 174/52.1; 248/298.1, 284.1, 346.06; 220/660; 411/179–183
See application file for complete search history.

(56) References Cited

U.S. PATENT DOCUMENTS

| | | | |
|---|---|---|---|
| 3,926,236 A * | 12/1975 | Pouch et al. | 411/179 |
| 6,170,858 B1 * | 1/2001 | Berger | 280/728.2 |
| 6,732,431 B2 * | 5/2004 | Muller | 29/874 |
| 6,741,477 B2 * | 5/2004 | Sivertsen | 361/752 |
| 7,028,389 B2 * | 4/2006 | Chang | 29/739 |
| 7,613,012 B2 * | 11/2009 | Hung et al. | 361/809 |
| 8,235,343 B2 * | 8/2012 | Tseng | 248/298.1 |
| 2012/0132772 A1 * | 5/2012 | Chiu et al. | 248/298.1 |
| 2012/0145723 A1 * | 6/2012 | Chiu et al. | 220/660 |

* cited by examiner

*Primary Examiner* — Minh Trinh
(74) *Attorney, Agent, or Firm* — Altis Law Group, Inc.

(57) ABSTRACT

A mounting apparatus includes a bottom panel, a first mounting member, and a second mounting member. The bottom panel includes a top surface and a bottom surface. The first mounting member includes a positioning portion and an installation portion. A concave portion is defined in the bottom surface, for receiving and preventing the positioning portion from rotating relative to the bottom panel. The bottom panel defines a through hole, for an installation portion. The second mounting member includes a locking portion. The locking portion defines an installation hole, for locking the installation portion. The bottom panel top surface t is between locking portion and positioning portion. The positioning portion bottom surface place in the same plane with the bottom panel bottom surface or is between the bottom panel top surface and the bottom panel bottom surface.

8 Claims, 4 Drawing Sheets

MOUNTING APPARATUS FOR CIRCUIT BOARD

BACKGROUND

1. Technical Field

The present disclosure relates to mounting apparatuses, and more particularly to a mounting apparatus for securing a circuit board to a bottom panel of a computer enclosure.

2. Description of Related Art

A typical mounting apparatus may include a screw and a screw nut. A screw includes a head portion and a shaft. The screw nut defines an installation hole. A bottom panel defines a through hole. A circuit board defines a screw hole. In use, the shaft is inserted into the through hole and the screw hole, and engaged into the installation hole to secure the circuit board to the bottom panel. The head portion of the screw abuts the bottom panel. Thus, the head portion may increase the thickness of the bottom panel.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
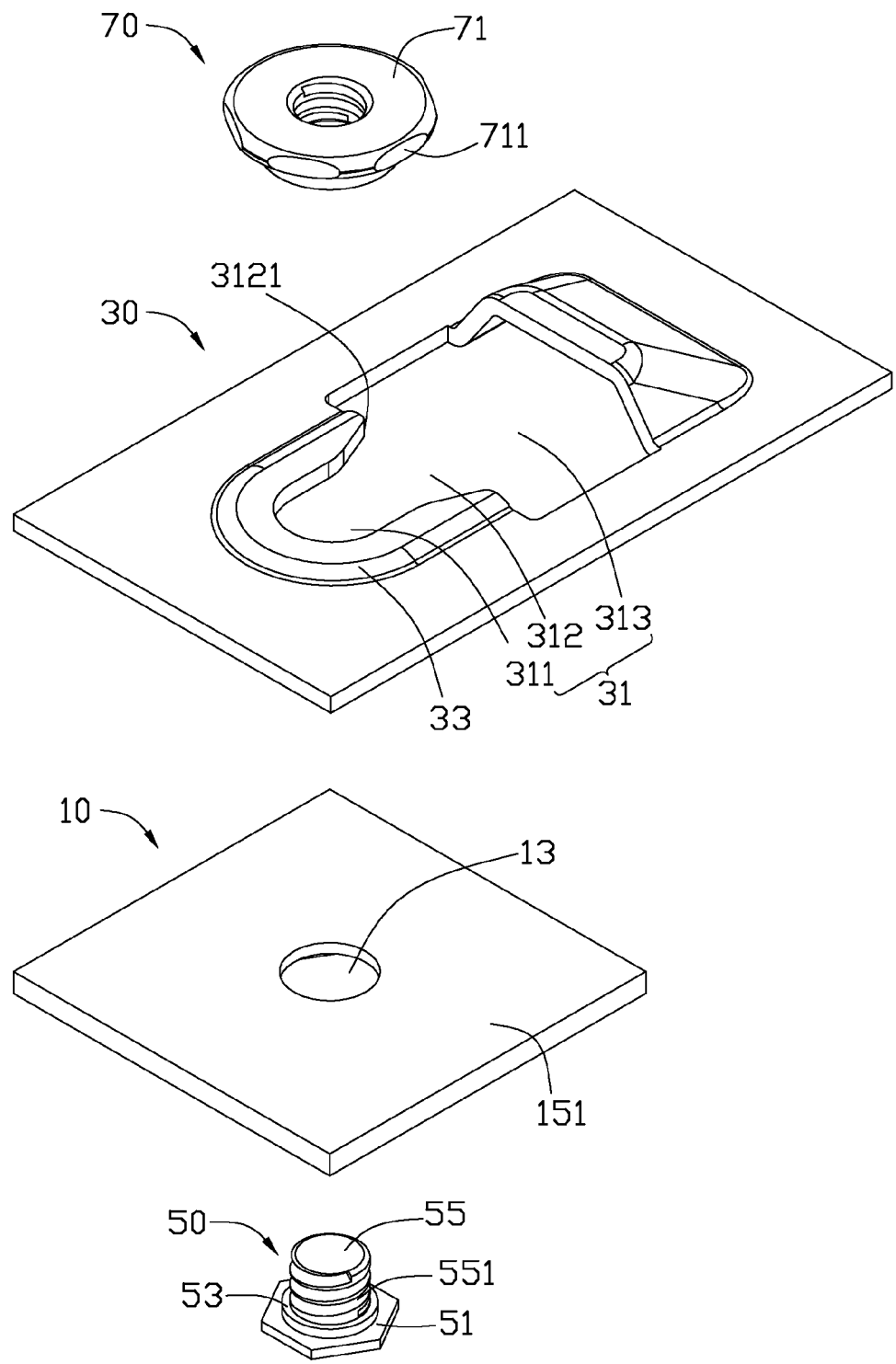
FIG. 1 is an exploded, isometric view of an embodiment of a mounting apparatus for a circuit board.
Figure 2:
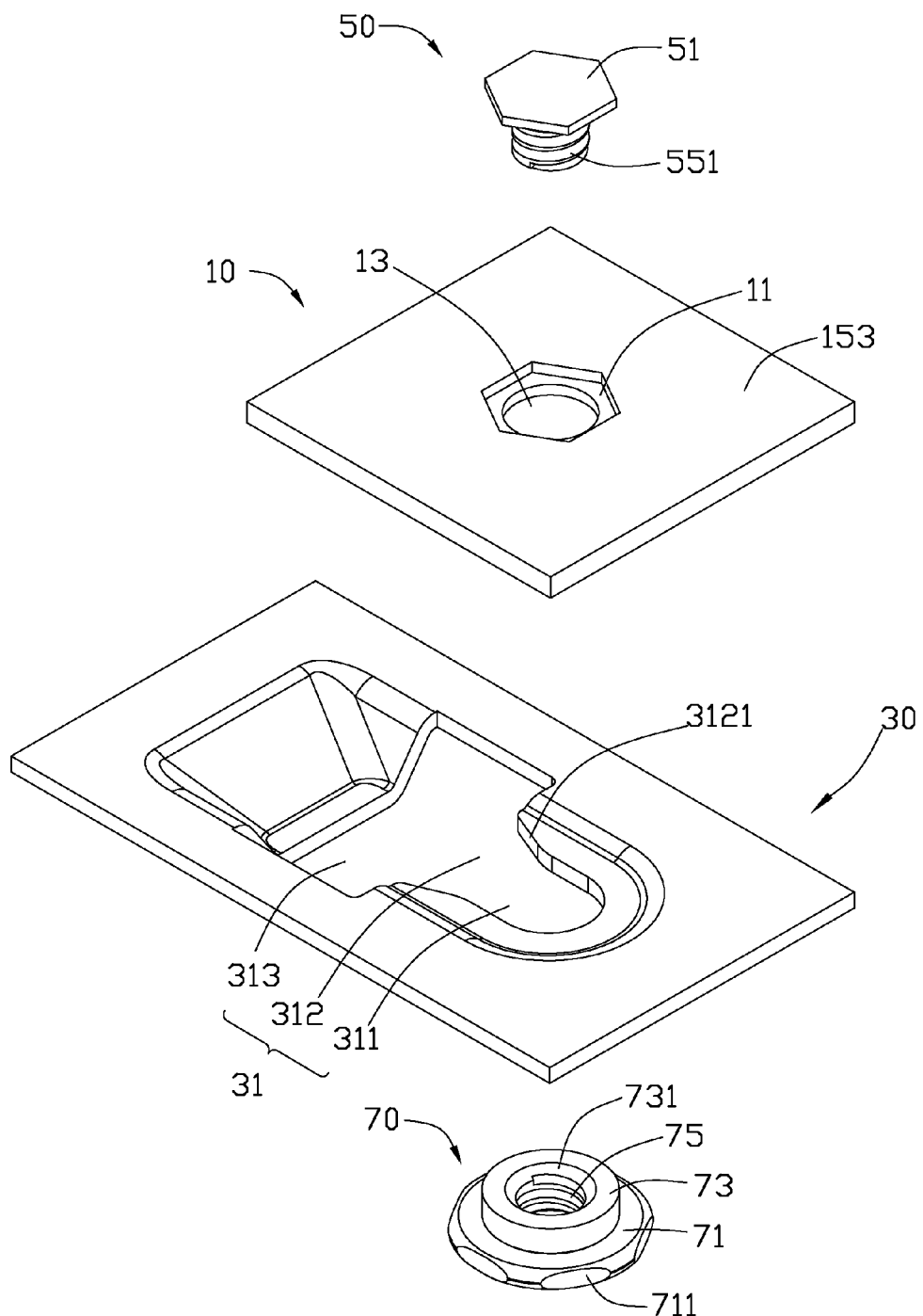
FIG. 2 is similar to FIG. 1, but viewed in a different aspect.

Referring to FIGS. 1-2, a mounting apparatus for securing a circuit board 30, in accordance with an embodiment, includes a bottom panel 10, a first mounting member 50, and a second mounting member 70. In one embodiment, the bottom panel 10 is a bottom panel of a computer enclosure.

The bottom panel 10 includes a top surface 151 and a bottom surface 153 opposite to the top surface 151. A polygon-shaped concave portion 11 is located in the bottom panel 10. A through hole 13 is defined in the concave portion 11. In one embodiment, the concave portion 11 is hexagon-shaped.

The circuit board 30 defines an installation opening 31. The installation opening 31 includes a narrow portion 311, a guiding portion 312 communicating with the narrow portion 31, and a wide portion 313 communicating with the guiding portion 312. A flange 33 surrounds the edge of the narrow portion 311 and the guiding portion 312. In one embodiment, the flange 33 is U-shaped. Two guiding surfaces 3121 are located on the flange 33. In one embodiment, the two guiding surfaces 3121 are two bevel surfaces.

The first mounting member 50 includes a positioning portion 51, a connecting portion 53 extending from the positioning portion 51, and an installation portion 55 extending from the connecting portion 53. In one embodiment, the installation portion 55 can extend from the positioning portion 51. The positioning portion 51 has a polygon-shape corresponding to the concave portion 11. A thickness of the positioning portion 51 is smaller than or equal to depressed depth of the concave portion 11. The positioning portion 51 can be received in the concave portion 11. The connecting portion 53 can be received in the through hole 13. A plurality of outer threads 551 is located on outer surface of the installation portion 55. In one embodiment, the positioning portion 51 is hexagon-shaped, and the installation portion 55 is column-shaped.

The second mounting member 70 includes a stopper portion 71 and a locking portion 73 extending from the stopper portion 71. A plurality of blocking portions 711 is located on the outer surface of the stopper portion 71, for facilitating the rotation of the stopper portion 71. A cross section of the stopper portion 71 is greater than a cross section of the locking portion 73 taken along a plane parallel to the bottom panel 10. An installation hole 75 is defined in the locking portion 73 through the stopper portion 71. A plurality of inner thread 731 is located on the inner surface of the installation hole 75, for engaging with the outer thread 551 of the first mounting member 50.

Figure 3:
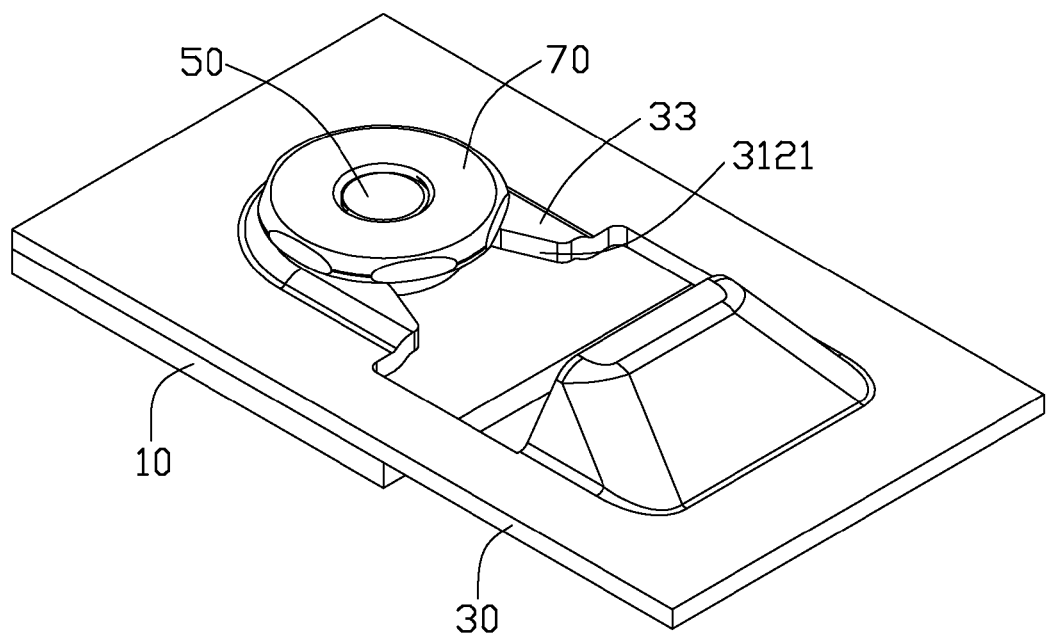
FIG. 3 is an assembled view of FIG. 1.
Figure 4:
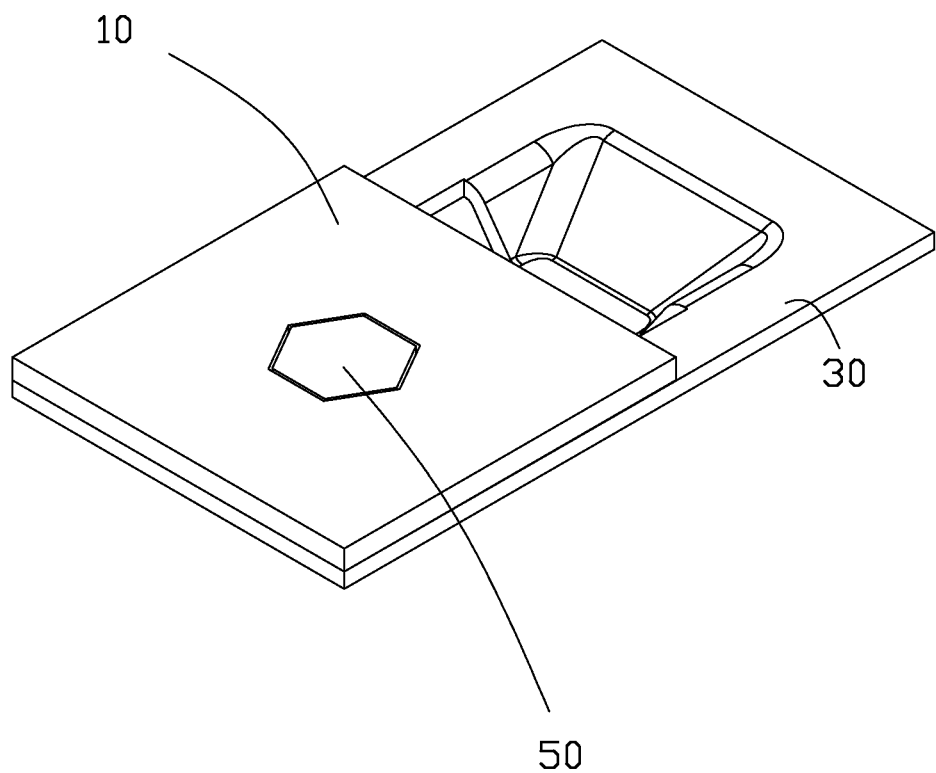
FIG. 4 is an assembled view of FIG. 2.

Referring to FIGS. 3-4, in assembly, the first mounting member 50 is moved toward the bottom panel 10, until the installation portion 55 is through the through hole 13. The positioning portion 51 is received in the concave portion 11, for preventing rotation relative to the bottom panel 10, and the connecting portion 53 is received in the through hole 13. The second mounting member 70 is moved towards the installation portion 55, until the installation hole 75 is aligned with the installation portion 55. The second mounting member 70 is rotated to drive the installation portion 55 into the installation hole 75, until the outer thread 551 completely occludes the inner thread 731. Therefore, the bottom panel 20 is secured to the first mounting member 50, and the locking portion 73 abuts the top surface 151 of the bottom panel 10. In this position, the locking portion 73 is between the bottom panel 10 and the stopper portion 71.

The stopper portion 71 is aligned to the wide portion 313 of the installation opening 31. The circuit board 30 is moved towards the bottom panel 10, until the second mounting member 70 extends through the wide part 313, and then it moves to the narrow part 311 until the second mounting member 70 contacts the flange 33 of the circuit board 30. At this time, the locking portion 73 is located in the narrow portion 313 of the circuit board 30. The stopper portion 71 resists the flange 22.

In disassembly, the circuit board 30 is moved, in the direction parallel to the bottom panel 11. The stopper portion 71 of the second mounting member 70 disengages from the flange 33 and the second mounting member 70 moves to the wide part 313 from the narrow part 311. Thereby the circuit board 20 is easily dismounted from the bottom panel 10.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus comprising:
   a bottom panel defining a top surface and a bottom surface;
   a concave portion located on the top surface, and a through hole defined in the concave portion;

a first mounting member comprising a positioning portion, and an installation portion; and a second mounting member comprising a locking portion and a stopper portion; and an installation hole is defined by the locking portion;

wherein the installation portion extends through the through hole and is engaged in the installation hole; the positioning portion abuts the concave portion; a thickness of the positioning portion is less than a depressed depth of the concave portion; a positioning portion bottom surface is located between the bottom panel top surface and the bottom panel bottom surface; and a circuit board is located between the stopper portion and the bottom panel; the stopper portion defines a plurality of blocking portions for rotation of the stopper portion; the installation opening comprises a narrow portion, a guiding portion communicating with the narrow portion, and a wide portion communicating with the guiding portion; and the stopper portion can extend through the wide portion.

2. The mounting apparatus of claim 1, wherein shape of the concave portion is polygon-shaped, and the positioning portion has a polygon shape that corresponds to the concave portion.

3. The mounting apparatus of claim 1, wherein the second mounting further comprises a connecting portion extending from the positioning portion, and the installation portion extends from the connecting portion.

4. The mounting apparatus of claim 3, wherein the connecting portion is received in the through hole when the installation portion extends through the through hole.

5. The mounting apparatus of claim 1, wherein the circuit board defines a flange surrounding the narrow portion and the guiding portion, and the stopper portion resists the flange.

6. The mounting apparatus of claim 5, wherein a thickness of the flange is less than the thickness of the circuit board.

7. The mounting apparatus of claim 5, wherein the flange is U-shaped.

8. The mounting apparatus of claim 1, wherein a cross section of the stopper portion is greater than a cross section of the locking portion taken along a plane parallel to the bottom panel.

* * * * *